United States Patent
Leibfritz et al.

(10) Patent No.: US 10,454,600 B2
(45) Date of Patent: Oct. 22, 2019

(54) METHOD FOR MEASURING GROUP DELAY ON A DEVICE UNDER TEST, MEASUREMENT DEVICE AS WELL AS MEASUREMENT SYSTEM

(71) Applicant: Rohde & Schwarz GmbH & Co. KG, Munich (DE)

(72) Inventors: Martin Leibfritz, Aying (DE); Werner Held, Pocking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/487,102

(22) Filed: Apr. 13, 2017

(65) Prior Publication Data

US 2018/0302179 A1   Oct. 18, 2018

(51) Int. Cl.
| | |
|---|---|
| *H04B 3/46* | (2015.01) |
| *H04B 17/364* | (2015.01) |
| *H04L 27/02* | (2006.01) |
| *H04L 27/00* | (2006.01) |
| *G01R 27/28* | (2006.01) |

(52) U.S. Cl.
CPC ....... *H04B 17/364* (2015.01); *H04L 27/0008* (2013.01); *H04L 27/02* (2013.01); *G01R 27/28* (2013.01)

(58) Field of Classification Search
CPC .............................. H04B 17/364; H04L 27/02
USPC ....................................................... 375/224
See application file for complete search history.

(56) References Cited

U.S. PATENT DOCUMENTS

| | | | | |
|---|---|---|---|---|
| 3,348,139 | A * | 10/1967 | Ranky .................... | G01R 27/32 324/621 |
| 4,084,132 | A * | 4/1978 | Fletcher ................. | G01R 27/28 324/621 |
| 4,845,691 | A * | 7/1989 | Itaya ...................... | G01R 27/28 368/120 |
| 6,046,595 | A * | 4/2000 | Wardle ................... | G01R 27/28 324/615 |
| 6,529,844 | B1 * | 3/2003 | Kapetanic ............. | G01R 23/20 324/601 |
| 6,798,830 | B1 * | 9/2004 | Tharakan ................. | H04B 3/46 375/224 |
| 8,841,923 | B1 * | 9/2014 | Vanwiggeren ..... | G01R 19/0053 324/606 |
| 8,842,771 | B2 | 9/2014 | Da Silva | |
| 8,983,796 | B2 | 3/2015 | Bednorz et al. | |
| 2004/0207447 | A1 * | 10/2004 | Chi ....................... | H03G 3/3036 327/306 |
| 2005/0174577 | A1 * | 8/2005 | Szafraniec ........... | G01M 11/331 356/477 |
| 2006/0156147 | A1 * | 7/2006 | Wu ...................... | G01R 31/2882 714/742 |

(Continued)

*Primary Examiner* — Helene E Tayong
(74) *Attorney, Agent, or Firm* — Christensen O'Connor Johnson Kindness PLLC

(57) ABSTRACT

A method for measuring group delay on a device under test is described, wherein a test signal with a carrier frequency is generated. An amplitude modulation is applied to said test signal in order to generate at least two group delay signals having frequencies that are symmetrical to the frequency of said test signal. At least said group delay signals are provided to said device under test. Further, a measurement device and a measurement system are described.

14 Claims, 2 Drawing Sheets

(56) References Cited

U.S. PATENT DOCUMENTS

2008/0258707 A1* 10/2008 Dunsmore ............. G01R 27/32
                                                    324/76.23
2010/0213924 A1*  8/2010 Osumi ................... G01R 27/32
                                                    324/76.44
2011/0288820 A1* 11/2011 Bednorz ................ G01R 23/20
                                                    702/176

* cited by examiner

METHOD FOR MEASURING GROUP DELAY ON A DEVICE UNDER TEST, MEASUREMENT DEVICE AS WELL AS MEASUREMENT SYSTEM

FIELD OF THE DISCLOSURE

Embodiments of the present disclosure relate generally to a method for measuring group delay on a device under test, a measurement device as well as a measurement system.

BACKGROUND

Group delay measurements are performed by a measurement device that is connected to a device under test in order to test its characteristics with regard to group delay behavior of a signal passing through said device under test. In general, the group delay relates to the delay of the amplitude envelopes of the signal transmitted, in particular a narrowband signal, wherein the group delay to be measured is caused by the device under test itself. Typically, the group delay, also called group delay time or time delay, occurs when the device under test is excited with a high frequency signal, for example a radio frequency signal. The occurring group delay time can be obtained from the rate of change of phase dependent upon the rate of change of frequency.

Typically, a network analyzer, for instance a vector network analyzer (VNA), is used as measurement device. Generally, the linear transmission behavior of the device under test has to be determined for different fields of application.

In the state of the art, the methods for group delay measurement are performed with a two-tone stimulus signal that is applied to the device under test as described in U.S. Pat. No. 8,983,796 B2, for instance. Since the time delay is different for various frequencies provided the device under test is not phase linear, two tones having different frequencies are used for determining the group delay behavior, in particular the phase linearity. Accordingly, a delay variation of both signals occurs as these signals are not delayed by the same amount of time. However, this method of measuring the group delay requires the usage of a combiner or to reconfigure the test setup in order to use a coupler as a combiner.

The methods known in the prior art require two different sources for providing the two-tone signal such that two ports of the measurement device are occupied for the purpose of measuring the group delay. Thus, these two ports required for the measurement cannot be used for any other measurement. Accordingly, the usability of the measurement device is limited. Furthermore, an external combiner or one of the couplers has to be used in order to combine the signals of both sources.

SUMMARY

Accordingly, there is a need for a method for measuring group delay, a measurement device as well as a measurement system that ensure performing group delay measurements in an easy manner while simultaneously providing a high usability of the measurement device or rather the measurement system.

To address this need, among others, the present disclosure provides examples of a method for measuring group delay on a device under test, with the following steps:
generating a test signal with a carrier frequency;
applying an amplitude modulation to the test signal in order to generate at least two group delay signals having frequencies that are symmetrical to the frequency of the test signal; and
providing at least the group delay signals to the device under test.

The group delay signals are the sideband signals generated due to the amplitude modulation of the test signal generated with the carrier frequency that are used for determining the group delay of the device under test. A hardware modification of the measurement system used for performing the above mentioned method is no more required. For instance, the amplitude modulation is done by using an attenuator or a modulator, in particular a high speed voltage controlled attenuator. Particularly, the attenuator or the modulator is part of a measurement device providing the group delay signals to the device under test.

Using a high speed voltage controlled attenuator for amplitude modulation, a time dependent control voltage can be applied in order to obtain the amplitude modulation as desired. Particularly, the power of the group delay signals, namely the sideband signals generated, can be altered by modifying the time dependent control voltage appropriately wherein the time dependent control voltage is a time variant signal. By modifying the time dependent control voltage, a multi-carrier stimulus can be obtained being used for putting stress to the device under test. Further, the power level can be lowered for sensitive devices under test.

Generally, the modulation can be arbitrary such that a user is enabled to define the frequency offset of the group delay signals generated. Alternatively or supplementary, the user may be enabled to set the absolute amplitudes of the group delay signals generated appropriately. Accordingly, different modulations can be provided depending on the kind of device under test. Small group delay signals can be used for ensuring symmetry of the signals. The amplitude modulation may be done while using a signal with a narrowband, high modulation frequency. Furthermore, the amplitude modulation may result in group delay signals having high power in order to obtain maximum sensitivity for a device under test being a passive one such as a mixer. Moreover, the power level of the group delay signals generated due to the amplitude modulation may be minimized for devices under test being high gain devices. Thus, low stimulation values are used. For instance, sinusoidal amplitude modulation, also called reflected amplitude modulation, or triangular amplitude modulation is used.

According to an aspect of the disclosure, a frequency drift of at least one of the group delay signals is measured at an output of the device under test. Thus, the characteristic of the device under test can be determined with regard to the group delay behavior. Particularly, the frequency drifts of both group delay signals are measured in order to verify the phase responds, also called phase difference, of the device under test.

According to another aspect of the disclosure, the test signal is provided to the device under test, the test signal with the carrier frequency passing through the device under test. The behavior of the device under test with regard to signals having a carrier frequency can also be obtained when the group delay behavior of the device under tested is determined simultaneously.

In embodiments, the carrier frequency is used to perform standard frequency characterization measurements. These standard frequency characterization measurements are used to determine the scattering parameters of the device under test, in particular a signal line of the device under test used for processing the signals received. The scattering parameters and the group delay behavior can be determined simultaneously while inputting a signal comprising the carrier frequency as well as the sideband signals generated by applying the amplitude modulation to the test signal generated. Accordingly, the measurement speed is doubled for measuring the scattering parameters as well as the group delay behavior.

The signals generated correspond to a multi-tone signal. As two group delay signals are generated due to the amplitude modulation, a multi-tone signal is provided to the device under test in order to determine the group delay time. As only one signal source is used to generate the multi-tone signal, a measurement device connected to the device under test can be used for further measurements as only one outgoing port of the measurement device is used for providing the multi-tone signal to the device under test in order to determine the group delay. Accordingly, the usability of the measurement device as well as a measurement system is increased.

Further, a measurement device is provided. The measurement device comprises a signal generation unit configured to generate a test signal with a carrier frequency. The measurement device has an amplitude modulation unit configured to apply an amplitude modulation to the test signal, the amplitude modulation unit being further configured to generate at least two group delay signals at frequencies that are symmetrical to the frequency of the test signal due to the amplitude modulation. The measurement device also comprises at least one outgoing port.

The amplitude modulation unit may comprise an attenuator and/or a modulator in order to modulate the amplitude of the test signal generated by the signal generation unit. For instance, the attenuator is a high speed voltage controlled attenuator wherein a time dependent control voltage is applied to obtain the amplitude modulation desired. As only one signal generation unit is provided being a single source, the multi-tone signal generated comprising both group delay signals can be output via a single outgoing port in order to stimulate the device under test while ensuring to determine the group delay appropriately. For instance, high speed voltage controlled attenuators may be used that are provided in the signal generation path of the front end of the measurement device. Thus, no additional components are required which reduces the costs.

The measurement device may be configured to automatically select a modulation type depending on settings. The settings may be done by the user who sets a desired frequency offset and/or absolute amplitudes for the group delay signals generated by applying the amplitude modulation to the test signal. Accordingly, the measurement device may be configured to generally apply different modulation types wherein one modulation type is automatically selected from the different types depending on the settings.

The measurement device may comprise an ingoing port configured to be connected with a device under test. Thus, an output signal of the device under test corresponding to the multi-tone signal generated by the measurement device that has passed the device under test can be forwarded to the measurement device in order to be measured and analyzed appropriately.

According to an aspect of the disclosure, the measurement device comprises a measurement unit configured to measure a frequency drift of the group delay signals. Thus, the group delay behavior of the device under test can be measured by the measurement device as the generated signal being processed by the device under test is measured with regard to a frequency drift caused by the device under test.

The measurement device may comprise an analyzing function. The analyzing function can be implemented in the measurement unit. Alternatively, a separately formed analyzing unit is provided for analyzing the measurement results obtained in the measurement unit.

Generally, the measurement device may be a vector network analyzer. Thus, the vector network analyzer may have a signal generation unit, a measurement unit as well as an analyzing unit. The vector unit network analyzer can be connected to the device under test ensuring that a multi-tone signal is generated that is forwarded to the device under test via a single outgoing port wherein the multi-tone signal is processed by the device under test and forwarded to the vector network analyzer in order to the analyze the output signal with regard to a frequency drift of the group delay signals.

The measurement device may be configured to perform a method as described above. Therefore, the advantages mentioned above with regard to the method also apply to the measurement device.

In addition, a measurement system is provided that has a device under test and a measurement device as mentioned above. As already mentioned, the device under test may be an active device, a passive device or any other suitable device to be tested with regard to group delay behavior wherein the amplitude modulation may be (automatically) adapted with regard to the kind of device under test. Particularly, a user of the measurement system sets certain parameters that are processed by the measurement system, in particular the measurement device, appropriately in order to ensure an optimal measurement on the device under test.

According to another embodiment, a method for measuring group delay on a device under test is provided, with the following steps:
    generating a digital test signal comprising at least two signals at frequencies that are spaced from each other in frequency by a known amount;
    converting the digital test signal into a multi-tone analog signal with a known modulation distance between the tones; and
    providing the multi-tone analog signal to the device under test.

Thus, the multi-tone signal can also be generated by a direct digital syntheses (DDS) based synthesizer itself. Using the DDS based synthesizer enables the possibility to suppress the carrier such that a multi-tone signal is forwarded having only two group delay signals (two tones) without any carrier frequency. Accordingly, the digital test signal generated consists of two signals. Even though, the multi-tone output signal does not cover the entire frequency band, the output signal can be multiplied by using specific generator stages of a measurement device such that the frequency range intended can be obtained. Accordingly, a large variety of signal shapes as well as a comfortable control/generation is provided.

According to an aspect of the disclosure, a frequency drift on at least one of both tones is measured at an output of the device under test. Accordingly, the group delay behavior of the device under test can be obtained in a similar manner while using a multi-tone signal being forwarded by a single output of the measurement device.

Further, a measurement device is provided, the measurement device comprising a signal generation unit configured to generate a digital test signal. The measurement device also has a converting unit configured to convert the digital test signal into a multi-tone analog signal with a known modulation distance between the tones. The measurement device further comprises at least one outgoing port. Accordingly, the multi-tone analog signal converted from the digital test signal generated by the signal generation unit is forwarded to a device under test via the single outgoing port. Thus, the usability of the measurement device is increased as only one outgoing port of the measurement device is occupied to perform the method for measuring group delay on the device under test.

According to an aspect of the disclosure, the measurement device comprises an ingoing port configured to be connected with a device under test. This ingoing port receives an output signal that has passed the device under test wherein this output signal corresponds to the multi-tone analog signal provided by the measurement device to the device under test.

According to another aspect of the disclosure, the measurement device comprises a measurement unit configured to measure a frequency drift on at least one of both tones at an output of the device under test. Particularly, the frequency drift on both tones is measured. Accordingly, the group delay behavior of the device under test can be determined by using the measurement device.

The measurement device may be configured to perform a method as mentioned above. The advantages described with regard to the method also apply to the measurement device in a similar manner.

Furthermore, a measurement system is provided that has a device under test and a measurement device as mentioned above. The advantages mentioned with regard to the measurement device also apply to the measurement system in a similar manner.

Furthermore, an input of the device under test may be connected with only one of several outgoing ports of the measurement device. Thus, the usability of the measurement device is increased as only a single outgoing port is used for being connected with the device under test in order to forward a multi-tone signal to the device under test used for performing the method of measuring group delay on the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
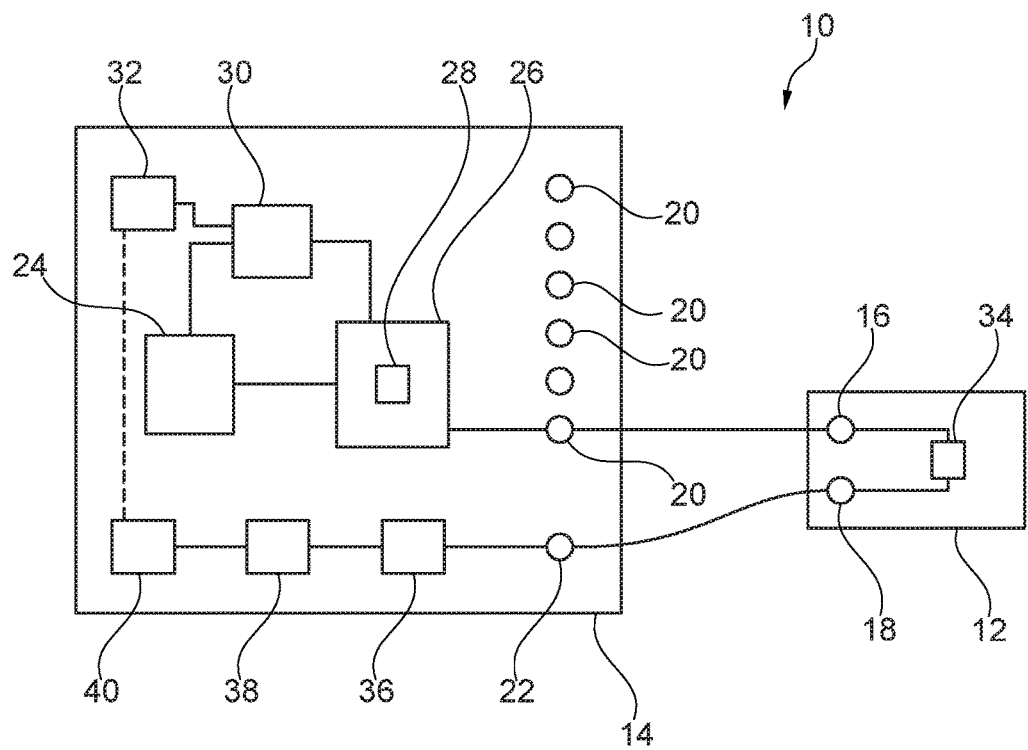
FIG. 1 shows a schematic overview of a measurement system according to a first embodiment.

In FIG. 1, a measurement system 10 is shown that comprises a device under test 12 and measurement device 14. The measurement system 10 is used to perform group delay measurements on the device under test 12. Therefore, the device under test 12 is connected to the measurement device 14.

The device under test 12 has an input 16 as well as an output 18. The device under test 12 is connected to the measurement device 14 via its input 16 that is connected to a single outgoing port 20 of the measurement device 14. Further, the device under test 12 is connected to the measurement device 14 via its output 18 that is connected to an ingoing port 22 of the measurement device 14.

As shown in FIG. 1, the measurement device 14 may comprise several outgoing ports 20 that can be used for certain, in particular different, measurements to be applied on the device under 12 or any other devices (not shown). The measurement device 14 comprises a signal generation unit 24 that is configured to generate a test signal with a carrier frequency. The signal generation unit 24 may be a local oscillator being embedded in the measurement device 14.

The test signal generated is forwarded internally to an amplitude modulation unit 26 of the measurement device 14. The amplitude modulation unit 26 is configured to apply an amplitude modulation to said test signal such that at least two group delay signals are generated due to the amplitude modulation wherein the two group delay signals have frequencies that are symmetrical to the carrier frequency of said test signal. The group delay signals correspond to sideband signals generated while applying the amplitude modulation to the test signal generated in the signal generation unit 24.

For amplitude modulation, the amplitude modulation unit 26 may comprise at least one attenuator 28, in particular a high speed voltage controlled attenuator. The high speed voltage controlled attenuator for amplitude modulation is controlled by a control unit 30 via a time dependent control voltage being applied. Thus, it is ensured that the amplitude modulation desired is obtained.

In embodiments, the power of the sideband signals generated in the amplitude modulation unit 26 can be altered by modifying the control voltage.

The control unit 30 may further control the signal generation unit 24 in order to influence the test signal generated in a certain manner.

In the shown embodiment, the control unit 30 is connected with an interface, for instance a graphical user interface, that enables a user of the measurement device 14 to input certain settings, for instance a desired amplitude or a desired frequency offset of the sideband signals generated.

The control unit 30 processes the settings input appropriately in order to automatically control the amplitude modulation unit 26 and/or the signal generation unit 24 ensuring an optimal amplitude modulation with regard to the settings of the user.

The generated signals, in particular the test signal with the carrier frequency and both group delay signals, correspond to a multi-tone signal that is forwarded to the single outgoing port 20 connected to the device under test 12. Hence, the multi-tone signal generated is output via the single outgoing port 20.

This multi-tone signal output via the single outgoing port 20 is received by the device under test 12, in particular its input 16 connected to the single outgoing port 20. The device under test 12 processes the multi-tone signal provided appropriately such that an output signal is provided at the output 18 of the device under test 12. The multi-tone signal input, in particular the test signal with the carrier frequency and both group delay signals generated, passes through the device under test 12, for instance a component 34 influencing the group delay behavior of the device under test 12. This component 34 may be a filter, a signal line or any other component having an influence on group delay of a signal passing through the device under test 12.

The output signal provided at the output 18 is forwarded to the ingoing port 22 of the measurement device 14. The ingoing port 22 of the measurement device 14 is connected to a measurement unit 36 of the measurement device 14 such that the output signal of the device under test 12 corresponding to the processed multi-tone signal input previously is measured with regard to a frequency drift of said group delay signals generated in the amplitude modulation unit 26 previously.

Accordingly, the measurement device 14 is enabled to measure a frequency drift of a multi-tone signal generated wherein the measurement device 14 is further configured to analyze the group delay behavior of the device under test 12 while measuring the frequency drift appropriately that is caused by the device under test 12.

As already mentioned, the test signal having the carrier frequency is also provided to the device under test 12 even though this signal is not used for determining the group delay behavior of the device under test 12. However, this signal can be used simultaneously in order to perform standard frequency characterization measurements on the device under test 12 in order to determine the scattering parameters, also called S-parameters. Therefore, the test signal generated by the signal generation unit 24 is passed through the device under test 12 such that the output signal also comprises this test signal that is measured within the measurement unit 36 of the measurement device 14 appropriately.

Therefore, the measurement speed is doubled for measuring the scattering parameters as well as the group delay behavior as both measurements are done simultaneously.

The measurement device 14 may also comprise an analyzing unit 38 as shown in FIG. 1 that is connected to the measurement unit 36. The analyzing unit 38 analyzes the measurement results obtained by the measurement unit 36 wherein the analyzing results are provided to an output unit 40, for instance a screen. Accordingly, a user of the measurement system 10, in particular the measurement device 14, can be informed about the results obtained.

The output unit 40, in particular the screen, may provide the input interface 32 simultaneously. This is indicated by the dashed line in FIG. 1. For instance, the output unit 40 is a touch-sensitive screen illustrating the graphical user interface used as input interface 32 for inputting the settings for the amplitude modulation to be performed.

Generally, the measurement device 14 may be a vector network analyzer.

Figure 2:
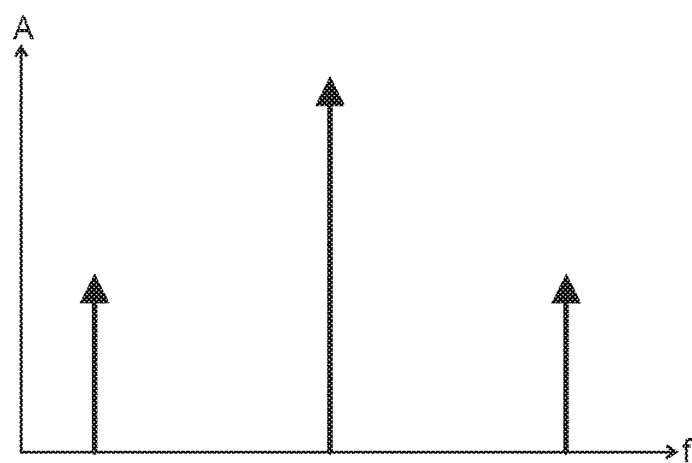
FIG. 2 schematically shows a multi-tone signal provided by a measurement device according to the first embodiment.

The multi-tone signal provided by the measurement device 14 that is forward to the device under test 12 via the single outgoing port 20 is shown in the diagram of FIG. 2. The diagram shows the amplitude over the frequency.

The test signal generated in the signal generation unit 24 with the carrier frequency is shown in the middle having the highest amplitude wherein both sideband-signals being symmetrical with regard to the frequency and the test signal are also shown.

Figure 3:
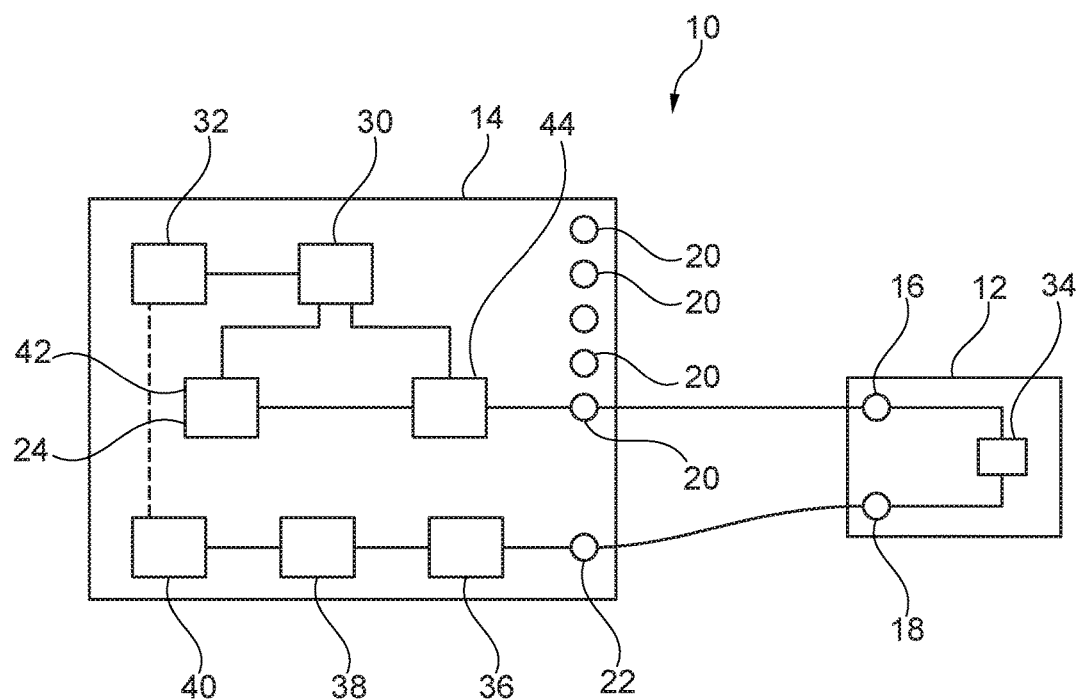
FIG. 3 shows a schematic overview of a measurement system according to a second embodiment.

In FIG. 3, a second embodiment of a measurement device 10 is shown wherein the signal generation unit 24 is configured to generate a digital test signal. Thus, the signal generation unit 24 is established by a direct digital syntheses (DDS) based synthesizer 42.

This digital test signal generated is forwarded internally to a converting unit 44 that is configured to convert said digital test signal into a multi-tone signal with a known modulation distance between the tones.

Thus, the converting unit 44 corresponds to the amplitude modulation unit 26 of the first embodiment with regard to its functionality as it provides a multi-tone signal being an analog one that is forwarded to the single outgoing port 20 in a similar manner as described for the first embodiment with regard to FIG. 1.

Thus, the frequency drift occurring while the signal passing through the device under test 12 is also measured in the measurement unit 36 wherein the measurement results obtained can be analyzed by the analyzing unit 38 appropriately.

Figure 4:
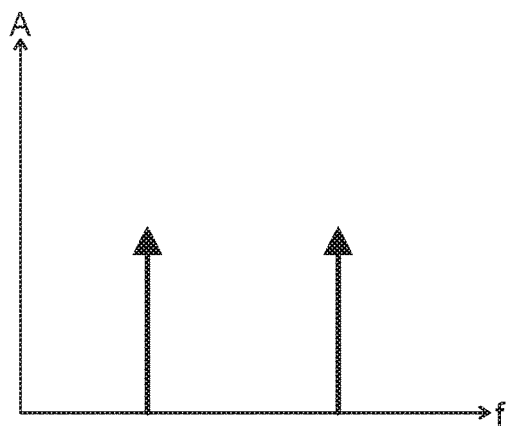
FIG. 4 schematically shows a multi-tone signal provided by a measurement device according to the second embodiment.

As shown in FIG. 4, the multi-tone signal provided at the single outgoing port 20 of the measurement device 14 has only two components such that the scattering parameters cannot be measured simultaneously.

Generally, a measurement system 10 as well as a measurement device 14 are provided that ensure an easy measurement of the group delay behavior of the device under test 12 as only a single outgoing port 20 of the measurement device 14 is used for providing a multi-tone signal to the device under test 12. Accordingly, the usability of the measurement device 14 is increased. This can be ensured as only a single source is used for providing the multi-tone signal. Accordingly, an efficient method for measuring group delay is also provided.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for measuring group delay on a device under test, with the following steps:
generating a test signal with a carrier frequency;
applying an amplitude modulation to said test signal in order to generate at least two group delay signals having frequencies that are symmetrical to the frequency of said test signal; and providing at least said at least two group delay signals to said device under test so that a multi-tone signal is provided to the device under test in order to determine the group delay time;

measuring a frequency drift of said at least two group delay signals caused by the device under test at an output of said device under test; and determining the group delay of the device under test by using only said at least two group delay signals generated by the amplitude modulation of said test signal.

2. The method according to claim 1, wherein said test signal is provided to said device under test, said test signal with said carrier frequency passing through said device under test.

3. The method according to claim 1, wherein said carrier frequency is used to perform standard frequency characterization measurements.

4. The method according to claim 1, wherein said signals generated correspond to the multi-tone signal.

5. A measurement device configured in a unitary manner, comprising:

a signal generator configured to generate a test signal with a carrier frequency;

an amplitude modulator configured to apply an amplitude modulation to said test signal, said amplitude modulator being further configured to generate at least two group delay signals at frequencies that are symmetrical to the frequency of said test signal due to said amplitude modulation, the at least two group delay signals corresponding to a multi-tone signal; and at least one outgoing port configured to be connected with a device under test so as to provide said multi-tone signal to the device under test for processing at said device under test;

an ingoing port configured to be connected with the device under test for receiving an output signal that corresponds to said multi-tone signal processed by said device under test; and an analyzer configured to analyze a frequency drift of said output signal received at said ingoing port in order to determine a group delay behavior of the device under test.

6. The measurement device according to claim 5, wherein said measurement device is a vector network analyzer.

7. A measurement system with a device under test and the measurement device according to claim 5.

8. The measurement system according to claim 7, wherein an input of said device under test is connected with only one of several outgoing ports.

9. The measurement device according to claim 5, wherein the amplitude modulator includes an attenuator.

10. A method for measuring group delay on a device under test, comprising the following steps:

generating, at a measurement device, a digital test signal comprising at least two signals at frequencies that are spaced from each other in frequency by a known amount;

converting, at said measurement device, said digital test signal into a multi-tone analog signal with a known modulation distance between the tones;

providing said multi-tone analog signal from the measurement device to said device under test for processing at said device under test;

receiving, at the measurement device, an output signal corresponding to said multi-tone signal processed by said device under test; and measuring a frequency drift on at least one of the tones of said output signal.

11. A measurement device comprising:

a signal generator configured to generate a digital test signal;

a converter configured to convert said digital test signal into a multi-tone analog signal with a known modulation distance between tones;

at least one outgoing port configured to be connected with a device under test so as to provide said multi-tone signal to the device under test for processing at said device under test;

an ingoing port configured to be connected with said device under test for receiving an output signal that corresponds to said multi-tone analog signal processed by said device under test; and an analyzer configured to analyze a frequency drift on at least one of the tones of said output signal.

12. The measurement device according to claim 11, wherein said
digital test signal comprising at least two signals at frequencies that are spaced from each other in frequency by a known amount.

13. A measurement system with a device under test and the measurement device according to claim 11.

14. The measurement system according to claim 13, wherein an input of said device under test is connected with only one of several outgoing ports of said measurement device.

* * * * *